US008455266B2

(12) United States Patent
Bhangale et al.

(10) Patent No.: US 8,455,266 B2
(45) Date of Patent: Jun. 4, 2013

(54) MULTI-STACK FERROELECTRIC POLYMER MEMORY

(75) Inventors: Sunil Madhukar Bhangale, Singapore Science Park II (SG); Takehisa Ishida, Singapore Science Park II (SG)

(73) Assignee: Sony Corporation, Tokyo (JP)

( * ) Notice: Subject to any disclaimer, the term of this patent is extended or adjusted under 35 U.S.C. 154(b) by 705 days.

(21) Appl. No.: 12/026,330

(22) Filed: Feb. 5, 2008

(65) Prior Publication Data
US 2008/0273367 A1 Nov. 6, 2008

(30) Foreign Application Priority Data

May 3, 2007 (SG) ............................... 200703050-5

(51) Int. Cl.
*H01L 21/02* (2006.01)

(52) U.S. Cl.
USPC ..... 438/3; 365/145; 365/49.13; 257/E27.104; 257/E21.663

(58) Field of Classification Search
USPC ........ 257/E27.104, E21.663; 438/3; 365/117, 365/145, 129, 189.02, 49.13
See application file for complete search history.

(56) References Cited

U.S. PATENT DOCUMENTS

| 6,624,457 | B2 | 9/2003 | Li et al. |
| 6,858,862 | B2 | 2/2005 | Li et al. |
| 6,951,764 | B2 * | 10/2005 | Andideh ........................... 438/3 |
| 7,084,446 | B2 | 8/2006 | Isenberger |
| 2004/0070015 | A1 | 4/2004 | Lung |
| 2004/0100828 | A1 * | 5/2004 | Garney et al. ............. 365/189.02 |
| 2005/0242441 | A1 | 11/2005 | Thompson et al. |
| 2006/0048376 | A1 | 3/2006 | Andideh et al. |
| 2007/0166954 | A1 * | 7/2007 | Yamazaki et al. ............ 438/452 |

OTHER PUBLICATIONS

Singapore Office Action issued on Jun. 25, 2009, for corresponding Singapore Patent Application SG 200703050-5.

* cited by examiner

*Primary Examiner* — Daniel Whalen
*Assistant Examiner* — Suberr Chi
(74) *Attorney, Agent, or Firm* — K&L Gates LLP

(57) ABSTRACT

A memory device and method for manufacturing the memory device are provided. The memory device including a first electrode, a first ferroelectric polymer layer over the first electrode, a second electrode over the first ferroelectric polymer layer, a second ferroelectric polymer layer over the second electrode, a third electrode over the second ferroelectric polymer layer, and a protective layer between the first and second ferroelectric polymer layers. The first, second and third electrodes and the first and second ferroelectric polymer layers define first and second ferroelectric capacitor structures, the second electrode being common to the first and second ferroelectric capacitor structures.

13 Claims, 5 Drawing Sheets

MULTI-STACK FERROELECTRIC POLYMER MEMORY

CROSS REFERENCES TO RELATED APPLICATIONS

The present application claims priority to Singapore Patent Application 200703050-5 filed in the Singapore Patent Office on May 3, 2007, the entire contents of which being incorporated herein by reference.

BACKGROUND

The present application relates to a ferroelectric polymer memory device and a method for manufacturing such a device.

Ferroelectric memory based on ferroelectric polymers such as poly(vinyledene-difluoride) and its copolymers, is attracting much research interest. Though ferroelectric polymers exhibit much smaller remnant polarization compared to their inorganic counterparts, decent performances, simpler processing and significantly lower manufacturing costs have put ferroelectric polymer memory on the memory roadmap. The alleged demerits of having low remnant polarization can be overcome with proper design of the device configuration. For example, a greater overall response can be received by stacking memory cells to increase cell area.

Various methods of fabricating ferroelectric polymer memory devices with multi-stack or multi-layer configurations have been disclosed. One such fabrication method is described in U.S. Pat. No. 6,624,457, which discloses a method for fabricating a multi-rank, stacked polymer memory device. The method disclosed therein, however, requires repeated photolithography and is highly complicated. Another method of making a ferroelectric polymer memory device is disclosed in U.S. Pat. No. 6,858,862. The method disclosed therein, however, also requires repeated photolithography.

U.S. Pat. No. 7,084,446 discloses a polymer memory device comprising multi-layer memory stacks separated by insulating layers. Each multi-layer memory stack includes two layers of ferroelectric polymer material, each layer sandwiched between two sets of electrodes. Each multi-layer memory stack thus requires formation of three sets of electrodes. This adds to the manufacturing cost of the polymer memory device.

U.S. Patent Application Publication No. 2006/0048376A1 discloses a ferroelectric polymer memory having a plurality of stacked layers, each layer separated from an ensuing layer by a polyimide layer. The disclosed method employs a semiconductor substrate and requires patterning of metal electrodes by a reactive etching process. Further, because the polyimide layer completely segregates each memory stack from the next, each memory stack requires formation of two sets of electrodes. This adds to the manufacturing cost of the ferroelectric polymer memory.

Thus, there exists a need for a simple and inexpensive method of manufacturing a ferroelectric polymer memory device.

SUMMARY

The present application provides, in an embodiment, a memory device, comprising: a first electrode; a first ferroelectric polymer layer over the first electrode; a second electrode over the first ferroelectric polymer layer; a second ferroelectric polymer layer over the second electrode; a third electrode over the second ferroelectric polymer layer, the first, second and third electrodes and the first and second ferroelectric polymer layers defining first and second ferroelectric capacitor structures, wherein the second electrode is common to the first and second ferroelectric capacitor structures; and a polymeric protective layer between the first and second ferroelectric polymer layers.

In another embodiment, a method for manufacturing a memory device is provided. The method includes forming a first electrode; forming a ferroelectric polymer layer over the first electrode; forming a second electrode over the ferroelectric polymer layer; forming a protective layer over the ferroelectric polymer layer by deposition from a first solvent; and forming a subsequent ferroelectric polymer layer over the protective layer by deposition from a polymer solution comprising a second solvent; and wherein the protective layer is insoluble in the second solvent and the ferroelectric material of the first ferroelectric polymer layer is insoluble in the first solvent.

In an embodiment, the protective layer can be formed above the second electrode layer or alternatively below the second electrode layer.

In a further embodiment, a memory device is provided. The memory device includes at least three stacked ferroelectric polymer layers and a plurality of electrode layers, each adjacent pair of the ferroelectric polymer layers being spaced apart by a protective layer.

Additional features and advantages are described herein, and will be apparent from, the following Detailed Description and the figures.

DETAILED DESCRIPTION

The present application will be described below with reference to the drawings according to an embodiment.

Figure 1:
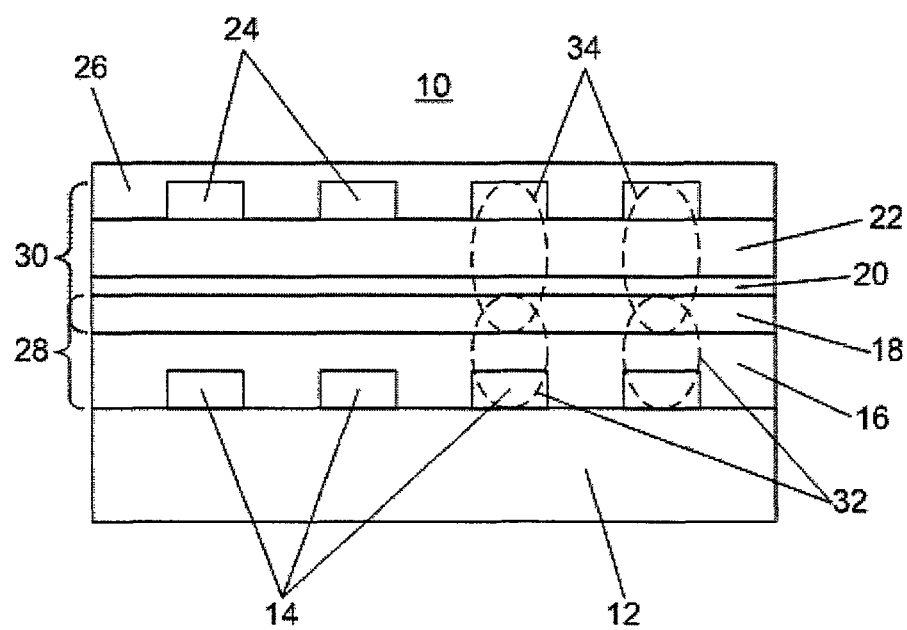
FIG. 1 is an enlarged cross-sectional view of a multi-stack memory device in accordance with one embodiment.

Referring now to FIG. 1, an enlarged cross-sectional view of a multi-stack memory device 10 is shown. The memory device 10 includes a substrate 12, a first set of electrodes 14 (extending into the page), a first ferroelectric polymer layer 16, a second set of electrodes 18 (only one electrode in the second set 18 is shown in FIG. 1), a first protective layer 20, a second ferroelectric polymer layer 22, a third set of electrodes 24 (extending into the page) and a second protective layer 26. The first set of electrodes 14 is formed on the substrate 12. The first ferroelectric polymer layer 16 is formed over the first set of electrodes 14 and extends over portions of the substrate 12 between adjacent electrodes in the first set 14. The second set of electrodes 18 is formed over the first ferroelectric polymer layer 16, the electrodes in the second set 18 extending transversely to those in the first set 14. The first protective layer 20 is formed over the first ferroelectric polymer layer 16 such that it extends over the second set of electrodes 18 and portions of the first ferroelectric polymer layer 16 between adjacent electrodes in the second set 18. The second ferroelectric polymer layer 22 is formed over the first protective layer 20. The third set of electrodes 24 is formed over the second ferroelectric polymer layer 22, the electrodes in the third set 24 extending transversely to those in the second set 18. The second protective layer 26 is formed over the second ferroelectric polymer layer 22 such that it extends over the third set of electrodes 24 and portions of the second ferroelectric polymer layer 22 between adjacent electrodes in the third set 24. The first, second and third sets of electrodes 14, 18 and 24 and the first and second ferroelectric polymer layers 16 and 22 define first and second ferroelectric capacitor structures 28 and 30, the second set of electrodes 18 being common to the first and second ferroelectric capacitor structures 28 and 30. More particularly, the first set of electrodes 14, the first ferroelectric polymer layer 16 and the second set of electrodes 18 define a first memory stack 28, and the second set of electrodes 18, the second ferroelectric polymer layer 22 and the third set of electrodes 24 define a second memory stack 30. The first and second memory stacks 28 and 30 are supported on the substrate 12.

As shown in FIG. 1, the first and third sets of electrodes 14 and 24 extend into the plane of the paper, while the second set of electrodes 18 lie parallel to the plane of the paper. Several cross-points between the first and second sets of electrodes 14 and 18 and between the second and third sets of electrodes 18 and 24 are thus formed by the arrangement of the first, second and third sets of electrodes 14, 18 and 24. A first memory cell 32 is defined at a location where an electrode in the second set 18 crosses an electrode in the first set 14, and a second memory cell 34 is defined at a location where an electrode in the third set 24 crosses an electrode in the second set 18. An array of first memory cells 32 and an array of second memory cells 34 are thus respectively defined in the first and second ferroelectric polymer layers 16 and 22 due to the cross-point configuration of the first, second and third sets of electrodes 14, 18 and 24; the multi-layer ferroelectric polymer memory device 10 consists of two (2) stacks of ferroelectric polymer memory cells 32 and 34. The second set of electrodes 18 in the memory device 10 is shared between the first and second memory cells 32 and 34. Depending on the number of electrodes in each of the first, second and third sets 14, 18 and 24, a corresponding number of first and second memory cells 32 and 34 is formed in the memory device 10.

The substrate 12 is made of a polymeric material that is capable of withstanding a temperature of at least 150 degrees Celsius (° C.), for example, polyethylene terephthalate (PET), polyethylene naphthalate (PEN) and polyimide. The substrate 12 is flexible and is of any thickness, with about 20 μm to about 500 μm, or even up to 2000 μm, being typical.

The electrodes in the first, second and third set 14, 18 and 24 are of any shape (e.g. rectangular strips or L-shaped strips) and dimension (e.g., a width of between about 1 μm and about 1000 μm, and a thickness of between about 20 nm and about 500 nm), and are made of conducting materials such as, for example, silver (Ag), copper (Cu), nickel (Ni), aluminium (Al), gold (Au) or alloys thereof.

The first and second ferroelectric polymer layers 16 and 22 are made of known ferroelectric polymers such as, for example, poly(vinylidene fluoride) (PVDF) and a copolymer of vinylidene fluoride and trifluoride P(VDF-TrFE).

The first protective layer 20 protects the underlying first ferroelectric polymer layer 16 from damage during deposition of the second ferroelectric polymer layer 22 and is made of any polymer possessing the following properties:

(i) substantially non-electrically conducting (e.g. its electrical resistivity could be in the range from $1 \times 10^{10}$ Ohm-cm to $1 \times 10^{18}$ Ohm-cm)

(ii) film forming;

(iii) insoluble in the solvent of a polymer solution from which the second ferroelectric polymer layer 22 is deposited (i.e. the first protective layer 20 is not soluble in the solvent of the second ferroelectric polymer layer 22 and is therefore resistant to the solvent (e.g. dimethyl formamide and N-methyl pyrrolidone) in which the second ferroelectric polymer 22 is dissolved);

(iv) resistant to damage at processing conditions for forming the second ferroelectric polymer layer 22 (i.e. resistant to drying and annealing temperature cycles of the second ferroelectric polymer layer 22); and (v) optionally, ferroelectric.

The polymer from which the first protective layer 20 is formed is initially dissolved in a solvent and deposited under conditions that do not cause damage or deterioration to the substrate 12 and the underlying first ferroelectric polymer layer 16. In other words, the first ferroelectric polymer layer 16 is insoluble in a solvent from which the first protective layer 20 is deposited and is resistant to damage at processing conditions (e.g. drying or curing temperature and duration) for forming the first protective layer 20. The polymer from which the first protective layer 20 is formed should have at least one solvent that does not dissolve the underlying first ferroelectric polymer layer 16. At the same time, it should also not be soluble in the solvent which is used to dissolve the ferroelectric polymer of the second ferroelectric polymer layer 22. Examples of suitable polymeric materials for the first protective layer 20 include, but are not limited to, insulating thermoplastic polymers such as, for example, polyvinyl alcohol (PVA), cellulose acetate and modified analogues thereof and polyamides such as, for example, Nylon. Insulating thermoplastic polymers such as those mentioned are generally soluble in water, but insoluble in the common organic solvents that are used to deposit the second ferroelectric polymer layer 22. Nylons and ferroelectric polymers, such as P(VDF-TrFE), do not share common solvents. For example, the solvent N-methyl pyrrolidone dissolves a P(VDF-TrFE) copolymer, but not Nylon-11. The solvent m-cresol, on the other hand, dissolves Nylon-11, but not P(VDF-TrFE). The first protective layer 20 is of a thickness that provides protection to the underlying first ferroelectric polymer layer 16, but that does not impose very high insulation (or resistance) between the second set of electrodes 18 and the second ferroelectric polymer layer 22 it comes between (e.g. a thickness of between about 10 nm and about 200 nm).

The second protective layer 26 protects the multi-stack memory device 10 from wear and tear during usage.

Figure 2:
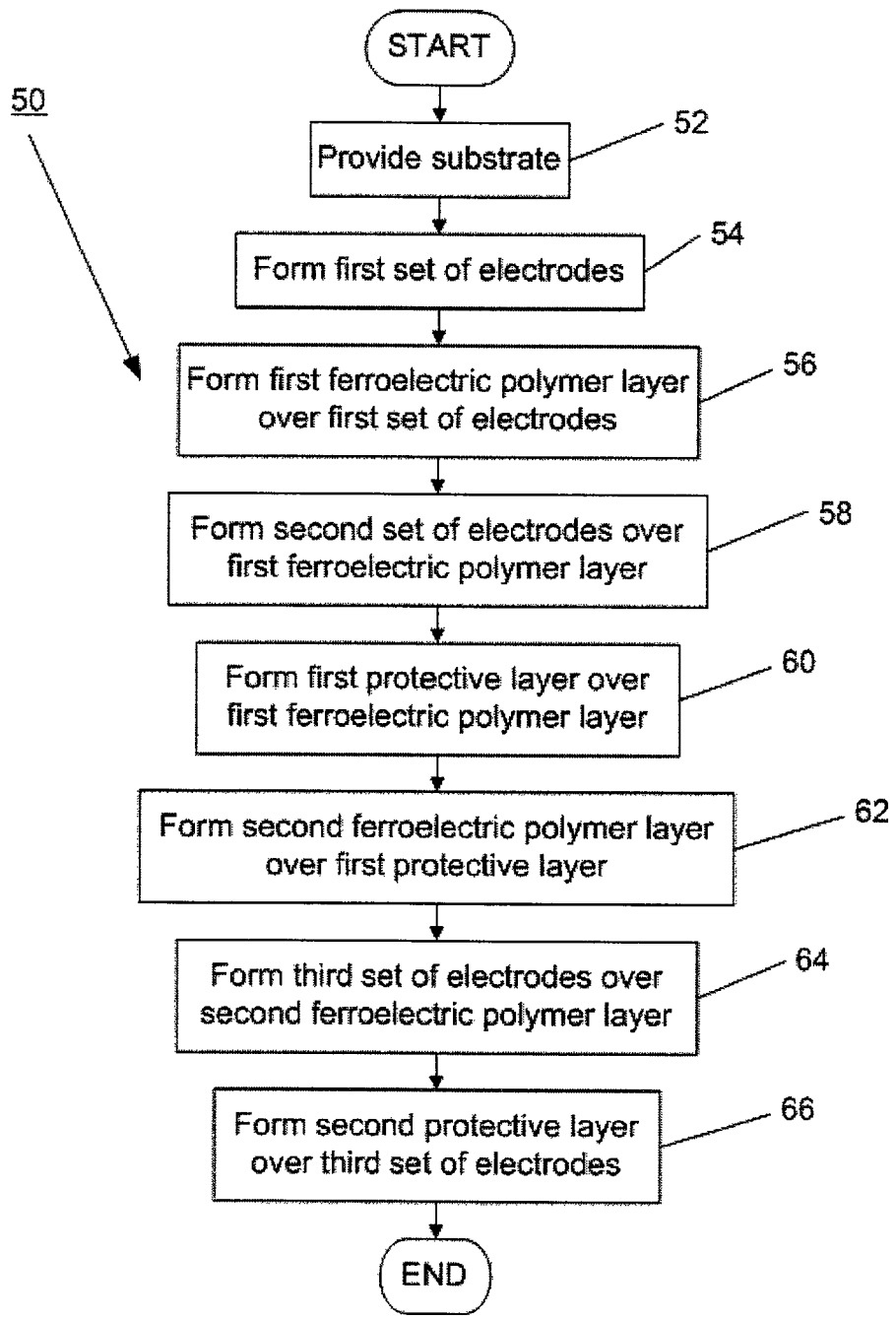
FIG. 2 is a schematic flow diagram of a method for manufacturing the multi-stack memory device of FIG. 1.

Having described the various components of the multi-stack memory device 10, a method for manufacturing the memory device 10 will now be described in greater detail below with reference to FIGS. 1 and 2. FIG. 2 shows a method 50 for manufacturing the multi-stack memory device 10 of FIG. 1.

In a first step 52, the substrate 12 is provided. The first set of electrodes 14 is formed on a top surface of the substrate 12 at step 54. At step 56, the first ferroelectric polymer layer 16 is formed over the first set of electrodes 14. The second set of electrodes 18 is formed over the first ferroelectric polymer layer 16 at step 58.

Deposition of a subsequent ferroelectric polymer layer from a polymer solution may damage an underlying ferroelectric polymer layer as the solvent in which the ferroelectric polymer is dissolved could also dissolve the underlying ferroelectric polymer layer. Consequently, to prevent damage to the first ferroelectric polymer layer 16, the first protective layer 20 is formed over the first ferroelectric polymer layer 16 at step 60 prior to forming a subsequent ferroelectric polymer layer over the first protective layer 20. The first protective layer 20 is deposited from solution using a known coating technique such as, for example, spin coating, dip coating and spray coating. Pre-treatments such as exposure to plasma, UV radiation or chemicals may be employed to prepare the underlying surface for deposition of the first protective layer 20.

The second ferroelectric polymer layer 22 is formed over a top surface of the first protective layer 20 at step 62. At step 64, the third set of electrodes 24 is formed over the second ferroelectric polymer layer 22. The second protective layer 26 is then formed over the third set of electrodes 24 at step 66. The second protective layer 26 is deposited from solution using a known coating technique such as, for example, spin coating, dip coating and spray coating.

The first, second and third sets of electrodes 14, 18 and 24 are deposited on the respective underlying surfaces using known deposition techniques such as, for example, screen printing, ink jet printing, vapour deposition through a mask, laser writing, laser-induced metallization and evaporation.

The first and second ferroelectric polymer layers 16 and 22 are deposited from a polymer solution using known coating techniques, for example, spin coating, dip coating, spray coating, or any other continuous coating method including, but not limited to, capillary coating, die coating, and doctor's blade coating.

Figure 3:
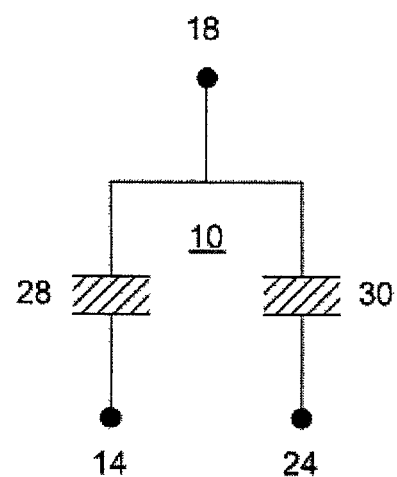
FIG. 3 is a schematic circuit diagram of two (2) stacked memory cells in the multi-stack memory device of FIG. 1.

Referring now to FIG. 3, a schematic circuit diagram of two (2) stacked memory cells 28 and 30 in the multi-stack memory device 10 of FIG. 1 is shown. The second set of electrodes 18 is common to and shared by the memory cells 28 and 30. The first and second memory cells 28 and 30 are independently driven by applying an independent electric field across the first and second sets of electrodes 14 and 18 and across the second and third sets of electrodes 18 and 24. When independently driven, the first and second memory cells 28 and 30 operate as two (2) independent memory cells, each having its own individual storage capacity. However, when the same electric field is applied to the first and third sets of electrodes 14 and 24, the first and second memory cells 28 and 30 are simultaneously driven and operate as a single memory cell. The output signal can thus be multiplied.

Figure 4:
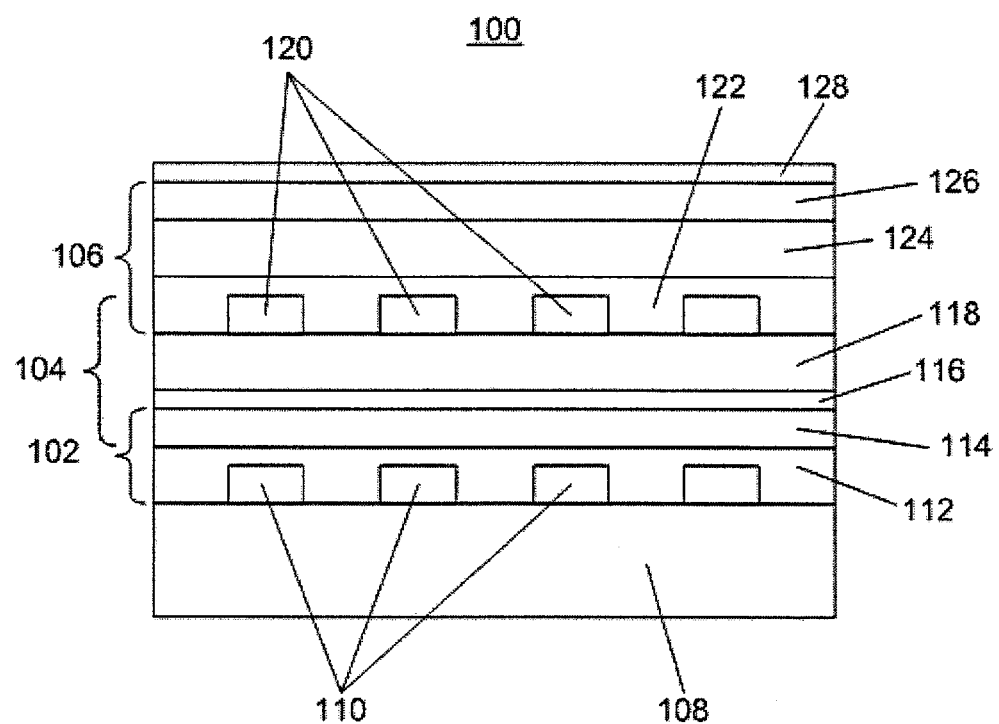
FIG. 4 is an enlarged cross-sectional view of a multi-stack memory device in accordance with another embodiment.

Referring now to FIG. 4, an enlarged cross-sectional view of a multi-stack memory device 100 having first, second and third memory stacks 102, 104 and 106 is shown. The memory device 100 includes a substrate 108 on which the first, second and third memory stacks 102, 104 and 106 are supported, a first set of electrodes 110 (extending into the page), a first ferroelectric polymer thin film 112, a second set of electrodes 114 (only one electrode in the second set 114 is shown in FIG. 4), a first protective layer 116, a second ferroelectric polymer thin film 118, a third set of electrodes 120 (extending into the page), a second protective layer 122, a third ferroelectric polymer thin film 124, a fourth set of electrodes 126 (only one electrode in the fourth set 126 is shown in FIG. 4) and a third protective layer 128. The first set of electrodes 110 is formed on the substrate 108. The first ferroelectric polymer thin film 112 is formed over the first set of electrodes 110 and extends over portions of the substrate 108 between adjacent ones of the electrodes in the first set 110. The second set of electrodes 114 is formed over the first ferroelectric polymer thin film 112, the electrodes in the second set 114 extending transversely to those in the first set 110. The first protective layer 116 is formed over the first ferroelectric polymer thin film 112 such that it extends over the second set of electrodes 114 and portions of the first ferroelectric polymer thin film 112 between adjacent electrodes in the second set 114. The second ferroelectric thin film 118 is formed over the first protective layer 116. The third set of electrodes 120 is formed over the second ferroelectric polymer thin film 118, the electrodes in the third set 120 extending transversely to those in the second set 114. The second protective layer 122 is formed over the second ferroelectric polymer thin film 118 such that it extends over the third set of electrodes 120 and portions of the second ferroelectric polymer thin film 118 between adjacent electrodes in the third set 120. The third ferroelectric thin film 124 is formed over the second protective layer 122. The fourth set of electrodes 126 is formed over the third ferroelectric polymer thin film 124, the electrodes in the fourth set 126 extending transversely to those in the third set 120. The fourth protective layer 128 is formed over the fourth set of electrodes 126 such that it extends over the fourth set of electrodes 126 and portions of the third ferroelectric polymer thin film 124 between adjacent electrodes in the fourth set 126. The first, second, third and fourth sets of electrodes 110, 114, 120 and 126 and the first, second and third ferroelectric polymer thin films 112, 118 and 124 define first, second and third ferroelectric capacitor structures 102, 104 and 106, the second set of electrodes 114 being common to the first and second ferroelectric capacitor structures 102 and 104 and the third set of electrodes 120 being common to the second and third ferroelectric capacitor structures 104 and 106.

As shown in FIG. 4, the multi-stack memory device 100 includes a plurality of stacked ferroelectric polymer layers 112, 118 and 124 and a plurality of electrode layers 110, 114, 120 and 126, each adjacent pair of the ferroelectric polymer layers 112, 118 and 124 being spaced apart by respective ones of the first and second protective layers 116 and 122. The third protective layer 128 protects the multi-stack memory device 100 from wear and tear during usage. The memory device 100 differs from the multi-stack memory device 10 of FIG. 1 in that it includes an additional memory stack (i.e. the third memory stack 106).

Although FIG. 1 shows two (2) memory stacks and FIG. 4 shows three (3) memory stacks, a multi-stack memory device having a greater number of memory stacks can be manufactured with the present application by replicating the memory stacks a number of times.

Figure 5:
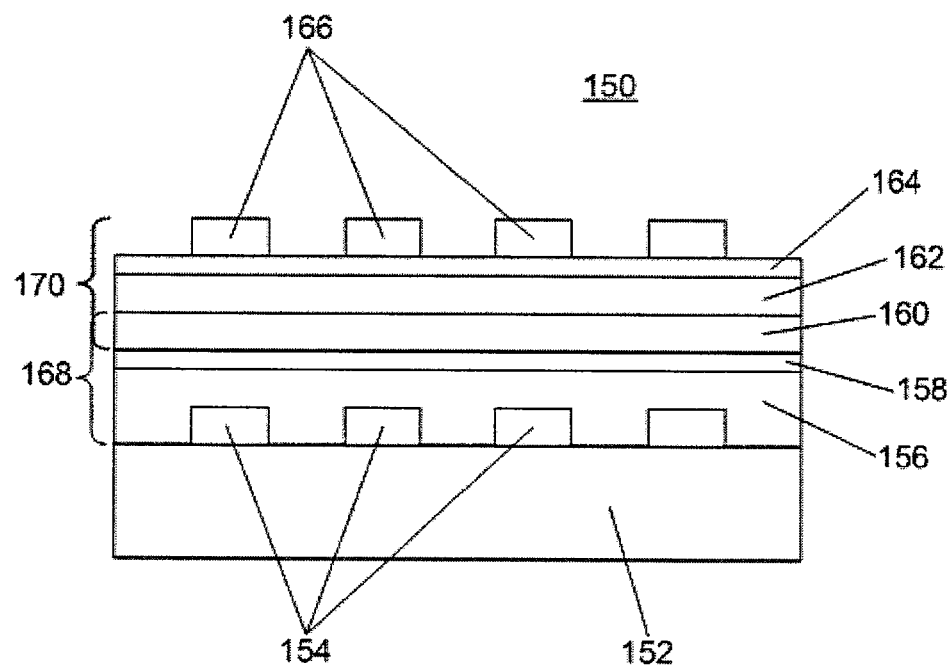
FIG. 5 is an enlarged cross-sectional view of a multi-stack memory device in accordance with yet another embodiment.

Referring now to FIG. 5, an enlarged cross-sectional view of a multi-stack memory device 150 is shown. The memory device 150 includes a substrate 152, a first set of electrodes 154, a first ferroelectric polymer layer 156, a first protective layer 158, a second set of electrodes 160 (only one electrode in the second set 160 is shown in FIG. 5), a second ferroelectric polymer layer 162, a second protective layer 164 and a third set of electrodes 166 (extending into the page). The first set of electrodes 154 is formed on the substrate 152. The first ferroelectric polymer layer 156 is formed over the first set of electrodes 154 and extends over portions of the substrate 152 between adjacent ones of the electrodes in the first set 154. The first protective layer 158 is formed over the first ferroelectric polymer layer 156, and the second set of electrodes 160 is formed on the first protective layer 158, the electrodes in the second set 160 extending transversely to those in the first set 154. The second ferroelectric layer 162 is formed over the second set of electrodes 160 such that it extends over the second set of electrodes 160 and portions of the first protective layer 158 between adjacent electrodes in the second set 160. The second protective layer 164 is formed over the second ferroelectric polymer layer 162 and the third set of electrodes 166 is formed over the second protective layer 164, the electrodes in the third set 166 extending transversely to those in the second set 160. The first, second and third sets of electrodes 154, 160 and 166 and the first and second ferroelectric polymer layers 156 and 162 define first and second ferroelectric capacitor structures 168 and 170, the second set of electrodes 160 being common to the first and second ferroelectric capacitor structures 168 and 170. More particularly, the first set of electrodes 154, the first ferroelectric polymer layer 156 and the second set of electrodes 160 define a first memory stack 168, and the second set of electrodes 160, the second ferroelectric polymer layer 162 and the third set of electrodes 166 define a second memory stack 170.

The memory device 150 differs from the multi-stack memory device 10 of FIG. 1 in that the second and third sets of electrodes 160 and 166 are directly formed on the first and second protective layers 158 and 164, respectively.

Two experiments were performed in accordance with the present application. These are described below.

Experiment 1

In the first experiment, P(VDF-TrFE) was dissolved in N-methyl pyrrolidone to form a polymer solution from which the ferroelectric polymer thin films were deposited using spin coating. The protective layers were formed by dissolving PVA in warm water and spin coating the resultant solution. As PVA is soluble in water, but not N-methyl pyrrolidone, deposition of the PVA protective layer did not damage the underlying P(VDF-TrFE) thin film. The PVA protective layer was then dried at a temperature of 100° C. for three hours (hrs). This also did not damage the underlying P(VDF-TrFE) layer. The PVA protective layer subsequently survived the spin coating process to form the second P(VDF-TrFE) thin film and the annealing process carried out at a temperature of 150° C. for a duration of three hrs.

Experiment 2

In the second experiment, Nylon-11 was dissolved in m-cresol and spin coated to form the protective layers. Nylon-11 is itself a weakly ferroelectric polymer, so may enhance the performance of the resultant memory device. The ferroelectric polymer thin films were formed from a polymer solution of P(VDF-TrFE) in N-methyl pyrrolidone. The other processing conditions were unchanged from the first experiment. A similar result as with the first experiment was achieved.

As is evident from the foregoing discussion, the present application provides a multi-stack, non-volatile, ferroelectric polymer memory device and a method for manufacturing the same. By introducing a protective layer between successive memory stacks in the multi-stack ferroelectric polymer memory device, an earlier formed ferroelectric polymer layer is protected from damage during the formation of a subsequent ferroelectric polymer layer for a subsequent stack. In this regard, the present application provides a simple and reasonably low cost fabrication technique for multi-stack ferroelectric memory devices. The present application can be used to produce cheaper, but high performance sheet-like memory for use in, for example, business cards, printing papers, identity cards, passports, work permits and the like.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A memory device, comprising:
a first set of electrodes;
a first ferroelectric polymer layer formed on the first set of electrodes;
a second set of electrodes formed on the first ferroelectric polymer layer and extending transversely to the first set of electrodes;
a polymeric protective layer formed on the first ferroelectric polymer layer and extending over the second set of electrodes, and portions of the polymeric protective layer being formed in spaces between adjacent electrodes in the second set of electrodes;
a second ferroelectric polymer layer formed directly on the polymeric protective layer; and
a third set of electrodes formed on the second ferroelectric polymer layer and extending transversely to the second set of electrodes,
wherein the first set of electrodes, the first ferroelectric polymer layer and the second set of electrodes form a first memory stack, and the second set of electrodes, the second ferroelectric polymer layer and the third set of electrodes form a second memory stack.

2. The memory device of claim 1, wherein the first ferroelectric polymer layer is insoluble in a solvent from which the protective layer is deposited.

3. The memory device of claim 1, wherein the second set of electrodes are formed on the protective layer.

4. The memory device of claim 1, wherein the polymeric protective layer is a film forming polymer.

5. The memory device of claim 1, wherein the first ferroelectric polymer layer is resistant to damage at processing conditions for forming the polymeric protective layer.

6. The memory device of claim 1, wherein the polymeric protective layer is resistant to damage at processing conditions for forming the second ferroelectric polymer layer.

7. The memory device of claim 1, wherein the polymeric protective layer has a thickness of between about 10 nm and about 200 nm.

8. The memory device of claim 1, wherein the polymeric protective layer comprises a polymeric material selected from the group consisting of polyvinyl alcohol, cellulose acetate, modified analogues of cellulose acetate, and polyamides.

9. The memory device of claim 8, wherein the polymeric material is a nylon.

10. The memory device of claim 1, wherein the polymeric protective layer is an electrical insulator.

11. The memory device of claim 1, further comprising a polymeric substrate on which the first set of electrodes are formed.

12. A memory device, comprising:
at least three stacked ferroelectric polymer layers and a plurality of electrode layers, each adjacent pair of the ferroelectric polymer layers being spaced apart by a protective layer, and each electrode layer including a set of electrodes extending transversely to one another,
wherein at least one of the protective layers comprise a polymeric material selected from the group consisting of polyvinyl alcohol, cellulose acetate, modified analogues of cellulose acetate, and polyamides,
wherein at least one of the protective layers is formed over one of the ferroelectric polymer layers and extends over one of the electrode layers, and portions of said protective layer is formed in spaces between adjacent electrodes in said electrode layer, and
wherein for at least one of the electrode layers including the set of electrodes extending transversely to one another, one of the protective layers and one of the ferroelectric polymer layers are both disposed between said set of electrodes.

13. The memory device of claim 12, wherein the polymeric material is a nylon.

* * * * *